United States Patent [19]
Ellenbecker

[11] 3,944,944
[45] Mar. 16, 1976

[54] POWER AMPLIFIER WITH DISTORTION CONTROL

[76] Inventor: Daniel G. Ellenbecker, 2323 N. 38th St., Milwaukee, Wis. 53210

[22] Filed: Oct. 24, 1974

[21] Appl. No.: 517,451

[52] U.S. Cl. .................. 330/149; 179/1 A; 330/15; 330/30 D; 330/85
[51] Int. Cl.² .......................................... H03F 1/26
[58] Field of Search ......... 330/9, 30 D, 69, 85, 149, 330/15; 179/1 A, 1 F, 1 P

[56] References Cited
UNITED STATES PATENTS

| | | | |
|---|---|---|---|
| 3,676,790 | 7/1972 | Beurrier | 330/149 X |
| 3,825,854 | 7/1974 | Pichal | 330/149 |

FOREIGN PATENTS OR APPLICATIONS

| | | | |
|---|---|---|---|
| 1,278,671 | 11/1961 | France | 330/149 |

*Primary Examiner*—James B. Mullins
*Attorney, Agent, or Firm*—Andrus, Sceales, Starke & Sawall

[57] ABSTRACT

An electrical audio power amplifier is connected to receive an input informational signal from a pre-amplifying stage functioning with a transducer or pick-up device such as a magnetic phono cartridge or tape head and connected to supply a transformerless output to drive a speaker to create audio sound waves substantially free of distortion. An input differential amplifier includes a first input supplying the input informational signal and a second input supplying the output informational signal and providing a differential output signal to an output amplifying stage including a pair of intermediate amplifiers and a power amplifier to directly provide the output informational signal to the speaker. A second compensating differential amplifier includes a first input supplying the input informational signal and a second input having a variable tapped impedance such as a resistor supplying the output informational signal and providing a compensating output signal in response to sensed distortion which is summed with the differential output signal provided by the input differential amplifier to substantially eliminate distortion.

11 Claims, 1 Drawing Figure

U.S. Patent   March 16, 1976   3,944,944
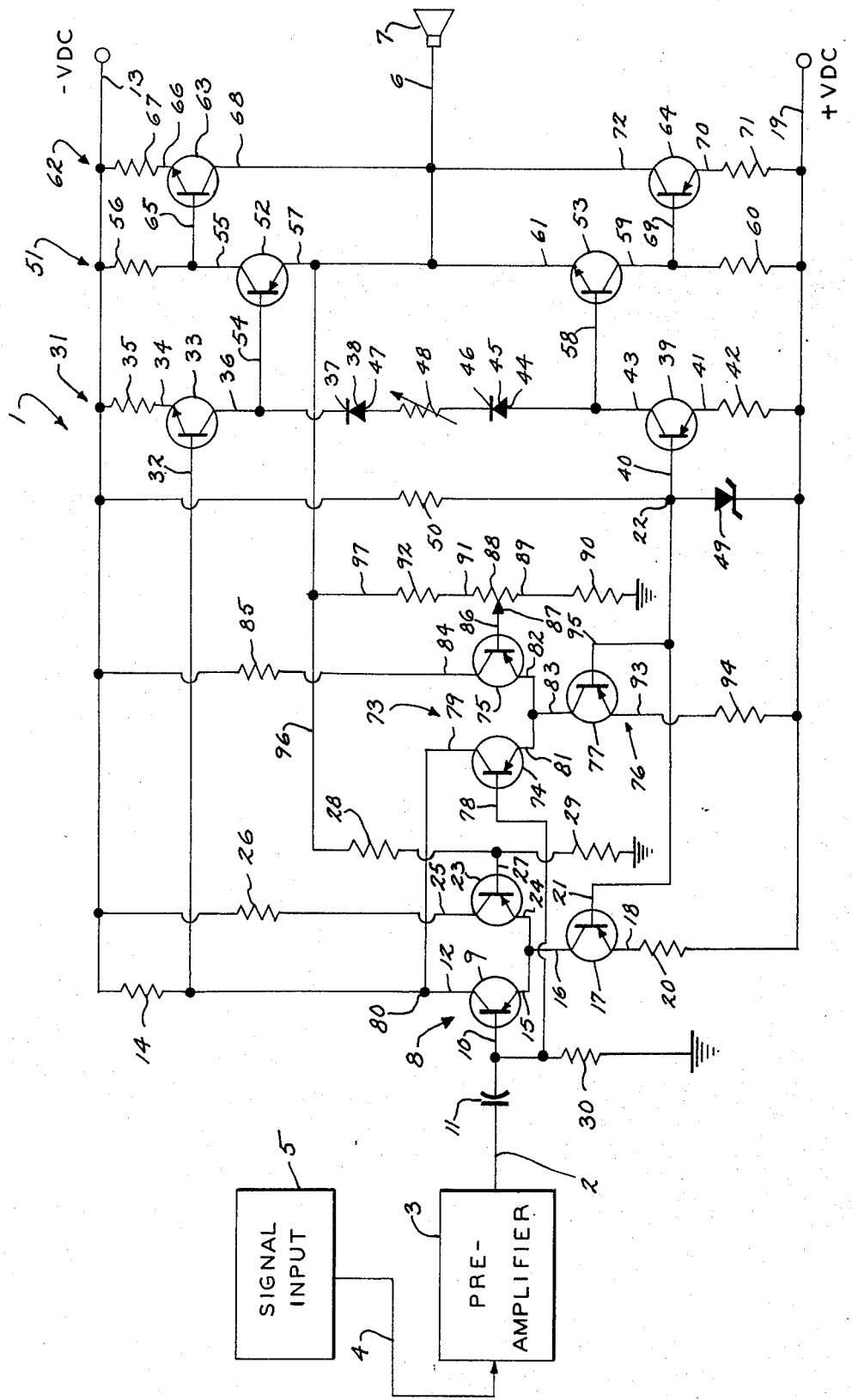

POWER AMPLIFIER WITH DISTORTION CONTROL

BACKGROUND OF THE INVENTION

This invention relates to a power amplifier for receiving an input informational signal and providing an amplified output informational signal which is substantially free of distortion.

Hi-fidelity circuits which respond to electrical audio signals such as commonly found in hi-fi and stereo phonograph systems, tape playing systems and possibly in radio systems or the like commonly utilize transistorized circuit configurations for efficient power transfer and signal amplification between a pre-amplifier operating in conjunction with a magnetic phono cartridge, tape head or other pick-up device and one or more loud speakers. It is essential for hi-fidelity reproduction of electrical audio signals to provide a wide frequency response which is particularly critical at the lower end of the audio frequency range and at the same time provide little or no distortion between the input and output signals.

Non-linear distortion has frequently existed in prior audio power amplifiers as evidenced by new frequencies appearing in the output which were not present in the input. Inter-modulation distortion also creates problems such as when the input signal contains more than one frequency and the output contains frequencies equal to the sums and differences of the input frequencies and of their harmonics. It is desirable to eliminate or substantially reduce such non-linear and inter-modulation distortion in order to provide desirable hi-fidelity signal reproduction which is particularly important for pleasant music listening in commercial sound systems.

Many electrical audio power amplifiers have utilized transistor circuits employing negative feedback to provide a wide frequency response and some distortion elimination. Some systems have employed voltage feedback over one or several transistor stages as supplied from a collector circuit of an output power transistor while other systems have employed a current feedback as supplied from an emitter circuit of an output power transistor, with either of such signals being fedback to a base circuit of an input transistor also coupled to receive the input informational signal from the pre-amplifier stage. Such systems had to be carefully designed to prevent high frequency instability such as might be caused when the phase shift through the transistor amplifier was sufficient to change the feedback from negative to positive magnitudes. Frequently, the frequency response of the feedback loop was limited to stabilize the circuit. In addition, the amount of feedback that could be applied to some audio power transistors was limited because of the poor frequency response in many of the common emitter and common collector connections.

Some audio power amplifiers have employed a pair of output power transistors which are directly coupled to drive one or more speakers thereby eliminating transformer coupling circuits. Such direct coupled audio power amplifying output transistors have frequently been connected in single ended class B push-pull arrangements for providing an excellent low frequency response.

Some audio power amplifiers have employed an input differential amplifier which provided a pair of amplifying transistors having emitter circuits connected in common configuration to a constant current source with the base circuit of a first transistor connected to receive the input informational signal from the pre-amplifier stage while the collector circuit provided an intermediate amplified signal responsive to the input informational signal. The second transistor stage of the input differential amplifier provided a base circuit which was connected to a current feedback circuit which supplied a compensating control signal in response to the amplified output informational signal for controlling the current flow from the constant current source through the second transistor amplifying stage of the input differential amplifier. The variance of current flow through the second transistor also correspondingly compensated the current conduction through the first transistor and provided partial distortion elimination in the intermediate amplified signal. While satisfactorily eliminating some distortion in the audio power amplifier, such a fedback compensating control signal had to be scaled to a substantially low magnitude with respect to the input informational signal in order to provide a differential output at the collector circuit of the first transistor stage. Simply increasing the magnitude of the feedback compensating control signal tended to null the differential intermediate output signal rendering the power amplifier inoperable or at least tended to reduce the amplification efficiency to a point where the power amplifier would be commercially undesirable. Thus, such compensating feedback to an input differential amplifier stage could only provide partial compensation while objectionable non-linear and inter-modulation distortion remained.

SUMMARY OF THE INVENTION

This invention relates to a power amplifier for receiving an input informational signal and providing an amplified output informational signal which is substantially free of distortion.

The power amplifier of the invention includes a first amplifying means which responds to the input informational signal to provide an amplified intermediate signal which, in turn, is amplified by a second means to provide the amplified output informational signal. Compensating means is connected to selectively modify the intermediate signal in response to the sensed distortion existing between the input informational signal and the output informational signal for eliminating distortion within the power amplifier.

In one form of the invention, the first amplifying means provides a first current signal in response to the input informational signal while the compensating means responds to both the input and output informational signals to selectively provide a second compensating current signal. Summing means is provided to sum the first and second current signals to provide a compensated output which is amplified by the second amplifying means to provide the output informational signal substantially free of distortion.

In a desirable construction of the invention, the compensating means includes a differential amplifier having a first current input operatively connected to receive the input informational signal while a second current input is operatively connected to receive the output informational signal. The compensating differential amplifier thus responds to the input and output informational signals to provide a compensating current output in response to sensed distortion to modify the intermediate signal output provided by the first amplifying means. In a highly desirable construction, the second current input to the compensating differential amplifier includes a variable impedance which is selectively adjusted to provide a null compensating current output in response to the lack of distortion. The compensating differential amplifier is preferrably connected to a constant current source so that the control supplied by the first and second current inputs regulates the supply of compensating output current to the summing means where it is summed with the output current signal supplied by the first amplifying means.

A desirable construction utilizes an input differential amplifier in combination with the compensating differential amplifier to, in effect, provide double compensation for sensed distortion existing between the output and input informational signals. The input differential amplifier is preferably connected to a constant current source and provides a first current input operatively connected to receive the input informational signal and a second current input operatively connected to receive the output informational signal to thereby provide the differential output current signal. A predetermined impedance is employed in the current feedback circuit to the second current input of the input differential amplifier to ensure that the differential output current is not nulled to zero although a reduced current feedback will have the effect of providing certain desirable distortion compensation such as found in some prior art audio power amplifiers. The invention thus provides a highly desirable and novel double distortion compensating scheme wherein distortion is roughly compensated within the input differential amplifying stage while the compensating differential amplifier is adjusted and designed to provide a highly exacting form of compensation to eliminate or substantially eliminate all distortion within the operating circuit.

In the preferred construction, the input differential amplifier includes a first transistor having an emitter circuit connected to a first constant current source and a base circuit connected to operatively receive the output informational signal through a first predetermined impedance. A second transistor circuit within the input differential amplifier also has an emitter circuit connected to the first constant current source and a base circuit connected to operatively receive the input informational signal while the collector circuit supplies an intermediate amplified signal to a summing circuit. The compensating differential amplifier includes a third transistor having an emitter circuit connected to a second constant current source and a base circuit connected to operatively receive the output informational signal through a second predetermined impedance including a selectively variable resistor. A fourth transistor within the compensating differential amplifier provides an emitter circuit also connected to the second constant current source and a base circuit connected to operatively receive the input informational signal and a collector circuit providing a compensating output in response to sensed distortion to the summing circuit. The amplified intermediate signal provided by the input differential amplifier and the compensating signal provided by the compensating differential amplifier are thus summed at the summing circuit to provide an amplified compensated signal to the output amplifying stages which may be connected to drive one or more speakers if desired for audio reproduction substantially free of distortion.

The output amplifyiing circuitry desirably provides a pair of output transistors connected in push-pull arrangement and each having a collector circuit directly connected to a speaker for providing audio sound waves which are substantially free of distortion. While the invention embodies a transformerless connection between the audio power amplifier and the speaker, it is understood that a coupling transformer could be employed with certain aspects of the invention.

BRIEF DESCRIPTION OF THE DRAWINGS

The drawing furnished herewith illustrates the best mode presently contemplated by the inventor and clearly discloses the above advantages and features as well as others which will be readily understood from the detailed description thereof.

In the drawing:

the single FIGURE is an electrical circuit schematic and block diagrammatical illustration showing an electrical audio power amplifier connected to receive an informational input signal supplied from a pre-amplifying stage operating with a pick-up device and functioning to supply an informational output signal to drive a speaker system.

DESCRIPTION OF THE PREFERRED ILLLUSTRATED EMBODIMENT

Referring to the drawing, a power amplifier 1 is connected to an input lead 2 to receive an input informational signal from a pre-amplifier stage 3 which, in turn, operates in response to a signal input supplied through a lead 4 from a signal input device 5. The power amplifier 1, in turn, provides an output informational signal through a single ended output lead 6 to a speaker 7. The signal input device 5 can constitute any one of a number of pick-up devices such as a magnetic phono cartridge, a tape head or other translating device well known in the art for converting mechanical oscillations, magnetic flux or other electro-magnetic signals, for example, to a corresponding electrical signal for conduction through the lead 4 to pre-amplifier 3. The pre-amplifier 3 can constitute a conventional circuit configuration which preferrably operates to increase the signal level appearing at lead 4 and provide compensation if required to equalize the input informational signal at lead 2 to provide a constant output for a given frequency. Many desirable pre-amplifiers could be employed with the invention such as selected from those set forth in the G.E. Transistor Manual, Sixth Edition, and published by the General Electric Company.

The audio power amplifier 1 includes an input differential amplifier 8 which includes a PNP type transistor 9 having a base input circuit 10 connected to the input lead 3 through a D.C. blocking capacitor 11 and a collector circuit 12 connected to a constant D.C. negative potential source lead 13 through a resistor 14. An emitter circuit 15 of the transistor 9 is connected to a collector circuit 16 of a PNP type transistor 17 operating as a constant current source. An emitter circuit 18 of the transistor 17 is connected to a constant D.C. positive potential source lead 19 through a resistor 20 while a base circuit 21 is connected to a junction circuit 22 providing a constant input control signal as described more fully hereinafter. A PNP type transistor 23 is part of the differential amplifier 8 and includes an emitter circuit 24 connected to the collector circuit 16 of transistor 17 providing the constant current source.

A collector circuit 25 is connected to the negative voltage source lead 13 through a resistor 26. A base circuit 27 is electrically connected to the output lead 6 through a resistor 28 and is also connected to the system reference potential or ground through a resistor 29 in conventional voltage divider configuration. The base circuit 10 of transistor 9 is also connected to the system reference potential or ground through a resistor 30.

The collector circuit 12 of the input transistor 9 is coupled to a first output amplifying stage 31 operating as a class A amplifier and specifically is connected to a base circuit 32 of a NPN type transistor 33. An emitter circuit 34 of the transistor 33 is connected to the negative voltage lead 13 through a resistor 35 while a collector circuit 36 is connected to the cathode 37 of a temperature responsive diode 38.

A PNP type transistor 39 also forms a part of the amplifying stage 31 and includes a base circuit 40 connected to the constant signal input 22 and an emitter circuit 41 connected to the positive voltage lead 19 through a resistor 42. A collector circuit 43 of the transistor 39 is connected to an anode circuit 44 of a temperature responsive diode 45 which, in turn, provides a cathode circuit 46 connected to an anode circuit 47 of the diode 38 through a variable resistor 48.

The constant control signal junction 22 is connected to the positive voltage lead 19 through a Zener diode 49 and to the negative voltage lead 13 through a resistor 50 for providing a clamped and highly regulated constant voltage signal.

The first output amplifying stage 31 including the transistors 33 and 39 together with the temperature responsive diodes 38 and 45 are coupled to a second output amplifying stage 51 including aa PNP type transistor 52 and a NPN type transistor 53. Specifically, the transistor 52 provides a base circuit 54 connected to the collector circuit 36 of transistor 33 and a collector circuit 55 connected to the negative voltage lead 13 through a resistor 56. An emitter circuit 57 of the transistor 52 is connected to the output lead 6 and also connected to the base circuit 27 of the input differential amplifier 8 through the resistor 28. The transistor 53 provides a base circuit 58 connected to the collector circuit 43 of the transistor 39 and a collector circuit 59 connected to the positive voltage lead 19 through a resistor 60. An emitter circuit 61 of the transistor 53 is connected to the output lead 6 and to the base circuit 27 of the input differential amplifier 8 through the resistor 28.

A power amplifying stage 62 includes a NPN type power transistor 63 and a PNP type power transistor 64 coupled to provide an output to the speaker 7. Specifically, the transistor 63 provides a base circuit 65 connected to the collector 55 of transistor 52 and an emitter circuit 66 connected to the negative voltage lead 13 through a resistor 67. A collector circuit 68 is connected to the output lead 6 and to the resistor 28. A base circuit 69 of the transistor 64 is connected to the collector circuit 59 of transistor 53 while an emitter circuit 70 is connected to the positive voltage lead 19 through a resistor 71. The transistor 64 also provides a collector circuit 72 connected to the output lead 6. The amplifying stage 62 including transistors 63 and 64 thus operates in a single-ended class B push-pull arrangement while the transistors 52 and 53 of amplifying stage 51 operate in a class B arrangement in the Darlington connection to increase the current gain.

A compensating differential amplifier 73 includes a PNP type amplifying transistor 74 and a PNP type amplifying transistor 75 which operates in differential fashion in combination with a constant current source 76 including a PNP type transistor circuit 77. A base circuit 78 of the transistor 74 is connected to the base circuit 10 of transistor 9 and thus is connected to the input lead 2 through the D.C. blocking capacitor 11. A collector circuit 79 of transistor 74 is connected to a summing circuit 80 which, in turn, is also connected to the collector circuit of transistor 9 of the input differential amplifier 8. An emitter circuit 81 of the transistor 74 and an emitter circuit 82 of the transistor 75 are connected in common to a collector circuit 83 of the transistor 77 providing the constant current source 76. A collector circuit 84 of the transistor 75 is connected to the negative voltage lead 13 through a resistor 85 while a base circuit 86 is connected to an adjustable tap 87 of a variable potentiometer 88. The potentiometer 88 includes a first output lead 89 connected to the system reference potential or ground through a resistor 90 and a second output 91 is connected to the output lead 6 through a fixed resistor 92. An emitter circuit 93 of the transistor 77 is connected to the positive voltage lead 19 through a resistor 94 while a base circuit 95 of the transistor 77 is connected to the constant signal junction 22.

In operation, an input informational signal generally in the audio range is supplied to the audio power amplifier 1 through the input lead 2 with accompanying D.C. components being blocked or filtered by the capacitor 11. The constant current transistor 17 operating in response to the fixed input control from 22 supplies an operating current to transistor 9 which, in turn, provides an amplified output to the summing circuit 80 through the collector circuit 12 in response to the input informational signal appearing at base circuit 10. Such an intermediate amplified output at 80 is amplified by the stages 31, 51 and 62 to provide an output informational signal which is supplied to the speaker 7 through the output lead 6. The output informational signal is feedback through a first feedback circuit 96 to control the conduction of the transistor 23.

In actual design construction, the fedback signal is scaled by the voltage divider including the resistors 28 and 29 to provide a base input at 27 providing a magnitude which is sufficiently less than the magnitude of the input informational signal appearing at the base circuit 10 in order to provide a differential output at the collector circuit 12. Equal magnitude signals appearing at base circuits 10 and 27 would result in a null output to the summing circuit 80 thus rendering the power amplifier 1 undesirable.

Such first level distortion compensation is provided in the differential amplifier 8 by varying the current conduction through the transistor 23 in response to the output informational signal to reduce in magnitude similar frequency components existing in the differential output at 12 and also partially provide compensation for sensed distortion components. The feedback circuit 96 thus provides certain compensation to partially eliminate non-linear and inter-modulation distortion although complete distortion elimination is impossible because of the requirement of the differential output to the summing circuit 80.

The differential amplifier within the compensating circuit 73 receives the output informational signal through a feedback circuit 97 and specifically through a voltage dividing network including fixed resistors 90 and 92 and the variable potentiometer 88. The constant current source 76 supplies a first current signal in response to the input informational signal through the transistor 74 to the summing circuit 80 and a second current signal through the transistor 75 in response to the output informational signal. In operation, the tap 87 is adjusted and set so that an input informational signal appearing at the base circuit 78 in phase with the output informational signal appearing at the base circuit 86 will supply a null output to the summing circuit 80. The compensating circuit 73 senses when distortion is not present and will not effect the differential output provided by the differential amplifier 8.

Non-linear or inter-modulation distortion occurring in the output informational signal as supplied through the feedback circuit 97 to the base circuit 86 effectively unbalances the compensating circuit 73 so that a compensating current signal is supplied to the summing circuit 80 through the collector circuit 79. In such manner, the differential output supplied from the transistor 9 to the summing circuit 80 is compensated according to the sensed distortion in the output informational signal to thereby provide an output informational signal substantially free of distortion. It should be understood that one or more amplifying stages, impedance matching circuits or both could be connected between the collector circuit 79 and the summing circuit 80 for proper operation.

The invention provides a highly desirable circuit for correcting non-linear and inter-modulation distortion within an audio power amplifier which is highly desirable for use in sound amplifying systems where hi-fidelity is of utmost importance.

Various modes of carrying out the invention are contemplated as being within the scope of the following claims particularly pointing out and distinctly claiming the subject matter which is regarded as the invention.

I claim:

1. A power amplifier for receiving an input informational signal and providing an amplified output informational signal, comprising first amplifying means including a first amplifier having an input receiving said input informational signal and an output providing an amplified intermediate output signal in response to said input informational signal, second amplifying means including a second amplifying stage having an input connected to said amplifier output and a third amplifying stage connected in series electrical circuit with said second stage and providing said amplified output informational signal in response to said intermediate signal, and compensating means sensing distortion between said input and output informational signals and connected to said first amplifier output and selectively modifying said intermediate signal for eliminating said distortion.

2. The power amplifier of claim 1, wherein said compensating means includes a differential amplifier having a first current input operatively receiving said input informational signal and a second current input operatively receiving said output informational signal and providing a compensating current output modifying said intermediate signal.

3. The power amplifier of claim 2, wherein said second current input is operatively connected to an output of said second amplifying means through a variable impedance selectively adjusted to provide a null compensating current output in response to the lack of distortion.

4. A power amplifier for receiving an input informational signal and providing an amplified output informational signal, comprising an input amplifier connected to receive said input informational signal and providing a first current signal at an output of said amplifier, means providing a second current signal varying in response to said input and output informational signals, summing means connected to said amplifier output and directly summing said first and second current signals and providing a compensated output signal, and means amplifying said compensated output signal and including a plurality of amplifying stages for providing said output informational signal substantially free of distortion.

5. The power amplifier of claim 4, wherein said second current signal means includes a differential amplifier connected to a constant current source and including a first current input operatively connected to receive said input informational signal and a second current input operatively connected to receive said output informational signal and an output supplying said second current signal to said summing means.

6. A power amplifier for receiving an input informational signal and providing an amplified output informational signal, comprising first amplifying means having a first input operatively connected to receive said input informational signal and a second input operatively connected to receive said output informational input signal and providing a differential output, second amplifying means operatively connected to receive said differential output and providing said output informational signal, and compensating means having a first input operatively connected to receive said informational input signal and a second input operatively connected to receive said output informational signal and providing a compensating output operatively connected to said differential output and compensating said informational output signal for eliminating distortion.

7. The power amplifier of claim 6, wherein said differential output and said compensating output are summed to provide an input to said second amplifying means.

8. An electrical power audio amplifier for receiving an input informational signal and providing an amplified output informational signal, comprising a first differential amplifier having first and second current amplifying means each having an input connected to a common output of a first constant current source with said first amplifying means conducting a first current signal in response to said output informational signal and said second amplifying means conducting a second current signal in response to said input informational signal and said first current signal, a second differential amplifier having third and fourth amplifying means each having an input connected to a common output of a second constant current source with said third amplifying means conducting a third current signal in response to said output informational signal and said fourth amplifying means conducting a fourth current signal in response to said input informational signal and said third current signal, summing means providing an intermediate output signal in response to said second and fourth current signals, and output amplifying means providing said amplified output informational signal in response to said intermediate output signal and substantially free of distortion.

9. The power amplifier of claim 8, wherein said first current amplifying means including a first transistor circuit having a first emitter circuit connected to said first constant current and a first base circuit connected to operatively receive said output informational signal through a first predetermined impedance, said second current amplifying means including a second transistor circuit having a second emitter circuit connected to said first constant current source and a second base circuit connected to operatively receive said input informational signal and a second collector circuit connected to said summing means, said third current amplifying means including a third transistor circuit having a third emitter circuit connected to said second constant current source and a third base circuit connected to operatively receive said output informational signal through a second predetermined impedance including a selectively variable resistor, and said fourth current amplifying means including a fourth transistor circuit having a fourth emitter circuit connected to said second constant current source and a fourth base circuit connected to operatively receive said input informational signal and a fourth collector circuit connected to said summing means.

10. The power amplifier of claim 8, wherein said second amplifying means is operatively connected to a preamplifier for receiving said input informational signal and said output amplifying means is operatively connected to supply said output informational signal to a speaker for converting said input informational signal to audio sound waves substantially free of distortion.

11. The power amplifier of claim 8, wherein said output amplifying means includes a pair of output transistors connected in a push-pull arrangement and each having a collector circuit directly connected to a speaker for converting said input informational signal to audio sound waves substantially free of distortion.

* * * * *

UNITED STATES PATENT AND TRADEMARK OFFICE
CERTIFICATE OF CORRECTION

PATENT NO. : 3,944,944
DATED : March 16, 1976
INVENTOR(S) : DANIEL G. ELLENBECKER It is certified that error appears in the above–identified patent and that said Letters Patent are hereby corrected as shown below:

Column 5, Line 34, Delete "aa" and substitute therefor ---a---;

Column 9, Line 6, After "current" insert ---source---.

Signed and Sealed this

Tenth Day of August 1976

[SEAL]

Attest:

RUTH C. MASON
Attesting Officer

C. MARSHALL DANN
Commissioner of Patents and Trademarks